(12) United States Patent
Hsieh et al.

(10) Patent No.: US 6,274,509 B1
(45) Date of Patent: Aug. 14, 2001

(54) GLOBAL PLANARIZATION METHOD FOR INTER-LAYER-DIELECTRIC AND INTER-METAL DIELECTRIC

(75) Inventors: Tzung-Rue Hsieh, Hsin Chu Hsien; Wen-Wei Lo, Ban-Chiao, both of (TW)

(73) Assignee: Mosel Vitelic, Inc., Hsin Chu (TW)

( * ) Notice: Subject to any disclaimer, the term of this patent is extended or adjusted under 35 U.S.C. 154(b) by 0 days.

(21) Appl. No.: 09/239,457

(22) Filed: Jan. 28, 1999

(51) Int. Cl.$^7$ .......................... H01L 21/31; H01L 21/469
(52) U.S. Cl. ..................... 438/761; 438/631; 438/633; 438/691; 438/692
(58) Field of Search ....................... 438/761, 778, 438/626, 631, 633–634, 645, 690–693

(56) References Cited

U.S. PATENT DOCUMENTS

| | | | |
|---|---|---|---|
| 5,169,491 | * 12/1992 | Doan | 156/636 |
| 5,552,346 | * 9/1996 | Huang et al. | 438/699 |
| 5,663,107 | * 9/1997 | Peschke et al. | 438/692 |
| 5,893,750 | * 4/1999 | Hause et al. | 438/633 |
| 6,022,788 | * 2/2000 | Gandy et al. | 438/424 |
| 6,069,081 | * 5/2000 | Kelleher et al. | 438/692 |

\* cited by examiner

*Primary Examiner*—Stephen D. Meier
*Assistant Examiner*—Jamie L. Brophy
(74) *Attorney, Agent, or Firm*—Chien-Wei (Chris) Chou; Tamiz Khan; Oppenheimer Wolff & Donnelly LLP

(57) ABSTRACT

A method of planarizing a layer of dielectric material is disclosed herein that is particularly suitable for planarizing inter-layer-dielectrics (ILD) or inter-metal-dielectrics (IMD). The planarizing method comprises the steps of depositing a layer of sacrificial oxide over the dielectric material, depositing a layer of amorphous silicon over the sacrificial oxide layer by either sputtering or plasma enhanced chemical vapor deposition (PECVD) at a temperature less than about 500 degrees Celsius, performing a first chemical-mechanical polishing of the amorphous silicon layer to form a self-aligned mask for a subsequent etching step, etching a portion of the sacrificial oxide layer to form a channel therein, and performing a second chemical-mechanical polishing to remove the remaining amorphous silicon layer and the remaining sacrificial oxide, and to substantially planarize the underlying dielectric material. The planarizing method of the invention has the advantage of not requiring a photolithography step required in a prior art planarization process. In addition, the planarization method of the invention has the advantage of not requiring a process step that subjects an integrated circuit to relatively high temperatures that can have adverse effects on metal conductors present therein.

19 Claims, 14 Drawing Sheets

GLOBAL PLANARIZATION METHOD FOR INTER-LAYER-DIELECTRIC AND INTER-METAL DIELECTRIC

FIELD OF THE INVENTION

This invention relates to a process of manufacturing an integrated circuit, and in particular, a process of planarizing a layer of material that has an irregular or uneven top surface topology.

BACKGROUND OF THE INVENTION

The process of manufacturing an integrated circuit or, more specifically, an application specific integrated circuit (chip) can be very complex. It may involve many processing steps, such as depositing a plurality of similar and/or dissimilar thin-film layers, etching, polishing and/or material removing similar and/or dissimilar thin-film layers, and implanting ions or dopants into various regions of a substrate and/or thin film layers, among many others steps. The process of manufacturing chips may be further complicated if distinct circuits and/or structures are formed on the same integrated circuit substrate. Often these distinct circuits and/or structures have different thin-film layer requirements, which leads them to have different thickness. Thus, forming them on a single substrate can create an irregular or uneven top surface topology.

Because of the resulting irregular or uneven top surface topology when generally distinct circuits and/or structures are formed on an integrated circuit substrate, a layer of material deposited on top of the surface substantially mimics the irregularity or unevenness of the underlying top surface topology. Such layer of material deposited on top of circuits and/or structures may include, for example, a dielectric layer, for separating and/or isolating the underlying circuits and/or structures from other circuits and/or structures such as an inter-layer dielectric (ILD) or an inter-metal-dielectric (IMD). It is essential that the dielectric layer have a substantially even top surface topology so that the overlying circuits and/or structures are formed on a surface having a substantially uniform height. Accordingly, planarization of the dielectric layer is typically undertaken.

FIG. 1 illustrates a cross-sectional view of a chip 10 having an embedded dynamic read access memory (DRAM) structure 12 formed at one region of the chip 10, and having an application-specific integrated circuit (ASIC) or periphery 14 of the chip 10. The DRAM structure 12 typically includes an electrically conductive layer, such as metallic conductors 16. As a result, it generally causes the embedded DRAM structure 12 to have a thickness requirement that is greater than other circuits, structures or regions of the chip 10, such as the ASIC region 14 of the chip 10. As a result, an ILD or IMD layer 18 uniformly deposited on top of both the embedded DRAM structure 12 and the ASIC region 14 of the chip 10 has an uneven top surface topology. This may result in the top surface of the ILD or IMD dielectric layer 18 having a height differential of ΔH from region-to-region of the chip 10. In order to substantially level the top surface of the ILD or IMD dielectric layer 18, conventional prior art planarization processes, such as involving sacrificial oxide etch back or chemical-mechanical polishing (CMP) without dummy pattern, are undertaken. These conventional prior art planarization processes, however, typically have undesirable side effects, such as they cannot reach global planarization. Hence, substantially interfering subsequent manufacturing processes.

FIGS. 2A–2C illustrate cross-sectional views of a chip 20 at sequential steps of a conventional prior art planarization process. As shown in FIG. 2A, the chip 20 used in this example has an embedded DRAM structure 22 formed at one region of the chip 20, and at another region such as ASIC or periphery 24 of the chip 20. For this example, it is assumed that the embedded DRAM structure 22 has a greater thickness than that of the ASIC region 24 of the chip 20. Accordingly, a dielectric layer 26 uniformly deposited on top of the embedded DRAM structure 22 and the ASIC region 24 of the chip 20 has an irregular or uneven top surface topology due to the difference in the thickness of the regions 22 and 24. This example chip 20 as described is the starting point for the conventional prior art planarization process described below with reference to FIGS. 2A–2C.

As illustrated in FIG. 2A, the conventional prior art planarization process begins by forming a layer of photoresist 28 on top of the dielectric layer 26 substantially above the ASIC region 24 of the chip 20, i.e., the region having a lower thickness requirement. The photoresist layer 28 may overlie a portion of a region of the dielectric layer 26 that is situated between the embedded DRAM structure 22 and the region 24 of the chip 20. However, no photoresist is formed on top of the dielectric layer 26 at the region directly over the embedded DRAM structure 22 and the remaining portion of the region between regions 22 and 24, so as to leave these regions exposed.

As illustrated in FIG. 2B, a second step in the conventional prior art planarization process is to perform an etching of the dielectric layer 26 at the regions not being masked by the photoresist 28, i.e. the region of the dielectric layer 26 that substantially overlies the embedded DRAM structure 22 (outlined in FIG. 2B as a dashed line since the material in that region has been removed). The etching of the dielectric layer 26 is performed in a manner that the height of the dielectric layer 26 overlying the embedded DRAM structure 22 is substantially the same height of the dielectric layer 26 overlying the ASIC region 24 of the chip 20. The photoresist 28 protects or masks the dielectric layer 26 overlying the region 24 from the etching step. As a result, at the completion of this step, the ILD or IMD layer 26 is somewhat planarized, except for a raised region 30 situated between the embedded DRAM structure 22 and the ASIC region 24 of the chip 20. The photoresist 28 is subsequently removed.

As illustrated in FIG. 2C, a final step in the conventional prior art planarization process is to perform a chemical-mechanical polishing (CMP) of the dielectric layer 26. This CMP step removes the raised region 30 and substantially planarizes the dielectric layer 26. The disadvantage of this conventional prior art planarization process is that it requires a photolithography step as described above with reference to FIG. 2A. This photolithography step is not desired since it increases the manufacturing time of the chip 20, increases the cost of producing the chip 20, and increases the complexity of the planarization process. Thus, there is a need for a method of planarizing the dielectric layer 26, or any irregular or uneven surface, without having to perform a photolithography step.

FIGS. 3A–3E illustrate cross-sectional views of an irregular or uneven top surface of a layer of material, such as a dielectric layer 50, at sequential steps of a second conventional prior art planarization process. For example, in the planarization of a shallow trench isolation (STI) process, a polysilicon layer is utilized as a self-aligned mask. As illustrated in FIG. 3A, the top surface of the dielectric layer 50 has an irregular or uneven topology, including alternating upper portions 52a and alternating lower portions 54a. FIG. 3A also illustrates the dielectric layer 50 at the start of the second conventional prior art planarization process.

As illustrated in FIG. 3B, a first step in the second conventional prior art planarization process is to deposit a conformal layer of a sacrificial oxide 56 over the uneven top surface of the dielectric layer 50, and deposit a conformal layer of polysilicon 58 over the sacrificial oxide layer 56. The polysilicon layer 58 is deposited using low pressure chemical vapor deposition (LPCVD) at a temperature of about 700 degrees Celsius. Since the top surface of the dielectric layer 50 has alternating upper portions 52a and alternating lower portions 54a, the sacrificial oxide layer 56 and the polysilicon layer 58 also have corresponding upper portions 52b and 52c, and corresponding lower portions 54b and 54c, respectively.

As illustrated in FIG. 3C, a second step in the second conventional prior art planarization process is to perform a first chemical-mechanical polishing (CMP) of the polysilicon layer 58 in order to remove the upper portions 52c of the polysilicon layer 58. This step leaves behind the lower portions 54c of the polysilicon layer 58, which serve as self-aligned masks for a subsequent etching step. This step also leaves the top surface of the upper portions 52b of the sacrificial oxide layer 56 exposed.

As illustrated in FIG. 3D, a third step in the second conventional prior art planarization process is to perform an etching of the upper portions 52b of the sacrificial oxide layer 56. The remaining lower portions 54c of the polysilicon layer 58 serve as self-aligned masks that help in defining the upper portions 52b of the sacrificial oxide layer 56. As a result, a plurality of channels 60 are formed within the sacrificial oxide layer 56 that are each at substantially the same height.

As illustrated in FIG. 3E, a final step in the second conventional prior art planarization process is to perform a second chemical-mechanical polishing (CMP) step to remove the remaining lower portions 54b and 54c of the sacrificial oxide layer 56 and the polysilicon layer 58, respectively, and to substantially planarize the top surface of the dielectric layer 50. The disadvantage with the second conventional prior art planarization process is that it requires the deposition of the polysilicon layer 58 using LPCVD at a relatively high temperature, i.e. at a temperature about 700 degrees Celsius. Such a high temperature has substantial adverse effects on metal conductors present in a chip, which results in a planarization process that is substantially not feasible. Accordingly, there is a need for a method of planarizing the dielectric layer 50, or any irregular or uneven surface, without having to perform any step which subjects the chip to such a high temperature.

SUMMARY OF THE INVENTION

One aspect of the invention disclosed herein is a method of planarizing a dielectric layer that has an irregular or uneven top surface. The advantage of the planarizing method of the invention is that it overcomes the drawbacks of the conventional prior art planarization methods. In particular, it overcomes the drawback of requiring a photolithography step as required by the first conventional prior art planarization process described above with reference to FIGS. 2A–2C. In addition, it overcomes the drawback of requiring a step that subjects an integrated circuit, and in particular, a metal conductor to high temperatures that can cause adverse effects on the metal conductor described above with reference to FIGS. 3A–3E. The planarization method of the invention is particularly suitable for planarizing a dielectric layer in a device having an inter-layer-dielectric (ILD) or an inter-metal-dielectric (IMD) of an integrated circuit.

The planarization method of the invention comprises an initial step of forming a substantially conformal layer of sacrificial oxide over the dielectric layer to be planarized (or material to be planarized, which need not be a dielectric), and forming a substantially conformal layer of amorphous silicon over the sacrificial oxide layer. Once these two layers are formed over the dielectric layer, it is followed by a step of removing a portion of the amorphous silicon layer to expose an underlying portion of the sacrificial oxide layer. This step is followed by a step of removing the exposed sacrificial oxide layer preferably by an etching process, whereby the remaining amorphous silicon layer acts as a self-aligned mask that defines the exposed sacrificial oxide layer. The etching of the sacrificial oxide layer forms at least a channel within the sacrificial oxide layer. Finally, a polishing step is performed to remove the remaining amorphous silicon and sacrificial oxide, and to substantially planarize the dielectric layer.

In the preferred embodiment, the forming of the amorphous silicon layer over the sacrificial oxide layer is performed by depositing amorphous silicon material by either sputtering or plasma enhanced chemical vapor deposition (PECVD). Both of these depositing techniques are preferably performed in an environment having a temperature of less than about 500 degrees Celsius. With such low temperatures, the adverse effects on metal conductors are minimized. Thus, it makes the planarization method of the invention particularly useful when metal conductors are present in an integrated circuit. This is a substantial advantage over the second conventional prior art planarization process previously discussed that requires deposition of polysilicon at a high temperature of 700 degrees Celsius. In addition, since the amorphous silicon serves as a self-aligned mask for a subsequent etching step, there is no need for the photolithography step required by the first conventional prior art planarization process previously discussed.

Also in the preferred embodiment, the step of removing a portion of the amorphous silicon layer to expose an underlying portion of the sacrificial oxide is performed by a first chemical-mechanical polishing step. Also, the step of etching the sacrificial oxide layer can be performed by either dry etching or wet etching. In addition, the polishing step to remove the remaining amorphous silicon and sacrificial oxide, and to substantially planarize the dielectric layer is preferably accomplished by a second chemical-mechanical polishing step.

IN THE DRAWINGS

DETAILED DESCRIPTION OF THE PREFERRED EMBODIMENTS

Figure 1:
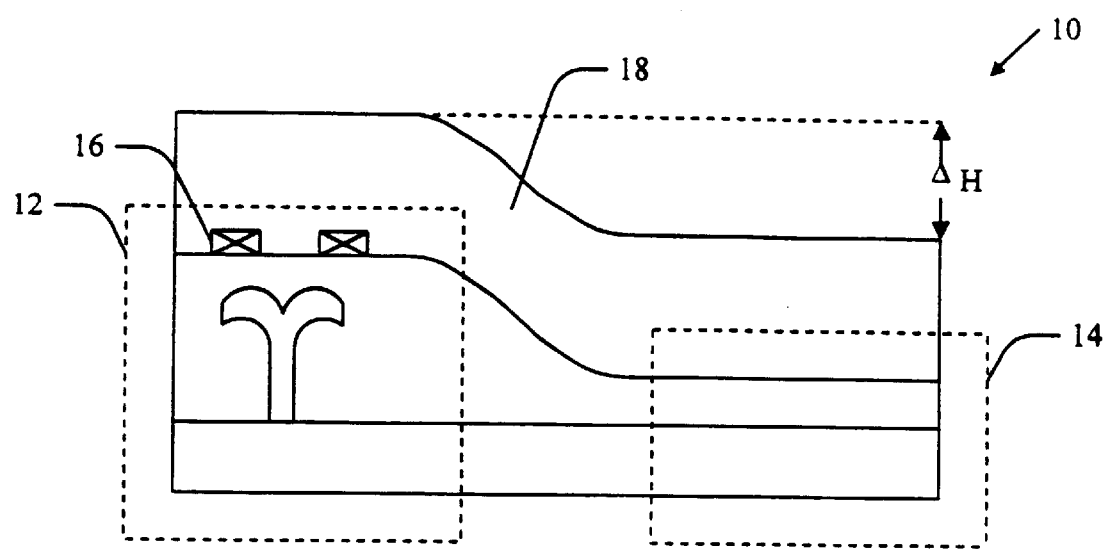
FIG. 1 illustrates a cross-sectional view of a prior art integrated circuit having an embedded dynamic read access memory (DRAM) structure.

FIGS. 4A–4E illustrate cross-sectional views of a semiconductor chip 70 at sequential steps of an example planarization method in accordance with the invention. Although a chip or integrated circuit is used to illustrate the planarization method of the invention, it shall be understood that other types of circuits, including for example, circuits formed on ceramic substrates can benefit from the planarization method of the invention. The example chip 70 used to illustrate the planarization method of the invention includes a circuit, structure, and/or region that has a greater height or thickness than that of another circuit, structure, and/or region of the chip 70. For the purpose of illustrating of the planarization method of the invention, the thicker region of the chip 70 includes an embedded dynamic random access memory (DRAM) structure 72, and the thinner region of the chip 70 includes another circuit, structure, and/or region of the chip 70 or can be an ASIC or periphery of the chip 70, but is designated in FIGS. 4A–4E as region 74.

The example chip 70 used to illustrate the planarization method of the invention includes a dielectric layer 76, which can be, but not necessarily limited to, an inter-layer-dielectric (ILD) or an inter-metal-dielectric (IMD). The dielectric layer 76 is deposited substantially uniformly over both the DRAM structure 72 and the region 74 of the chip 70. Since the embedded DRAM structure 72 has a greater thickness than the region 74 of the chip 70, the height of the dielectric layer 76 over the DRAM structure 72 is greater than its height over the region 74. In addition, since the DRAM structure 72 may include metal conductors 78 situated at the top of the DRAM structure 72, the top surface of the dielectric layer 76 may include ripples that generally mimic the underlying topology of the metal conductors 78 and/or other features of the top surface of the DRAM structure 72. These ripples in the dielectric layer 76 include alternating upper portions 80*a* and alternating lower portions 82*a*. For the purpose of illustrating the planarization method of the invention, the example chip 70 is the starting point for the planarization method of the invention.

Figure 4A:
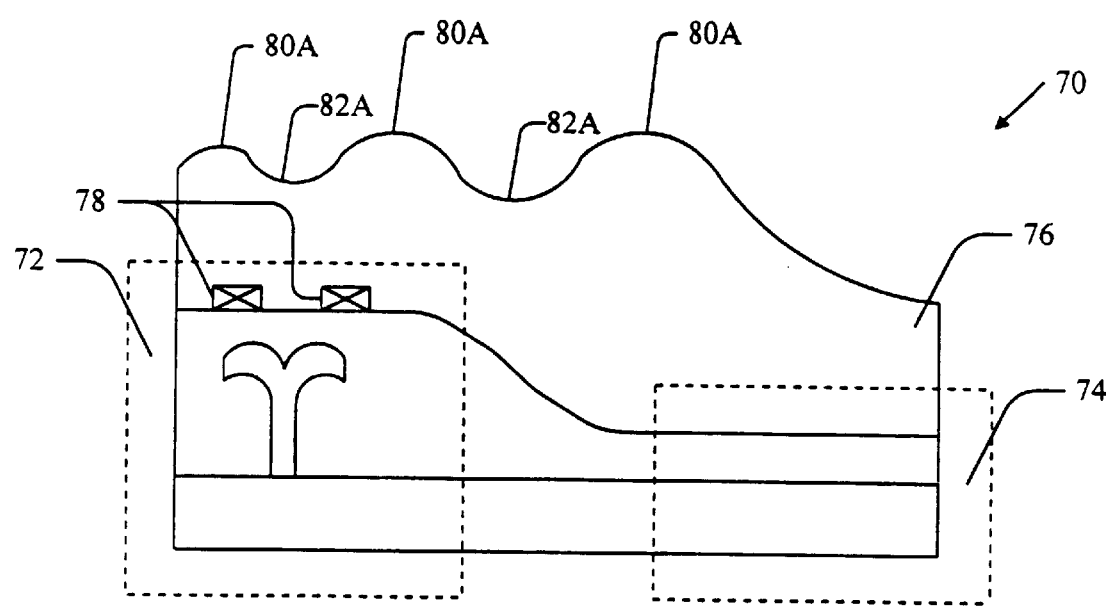
FIGS. 4A–4E illustrate cross-sectional views of an integrated circuit at sequential steps of an example planarization method in accordance with the invention.
Figure 4B:
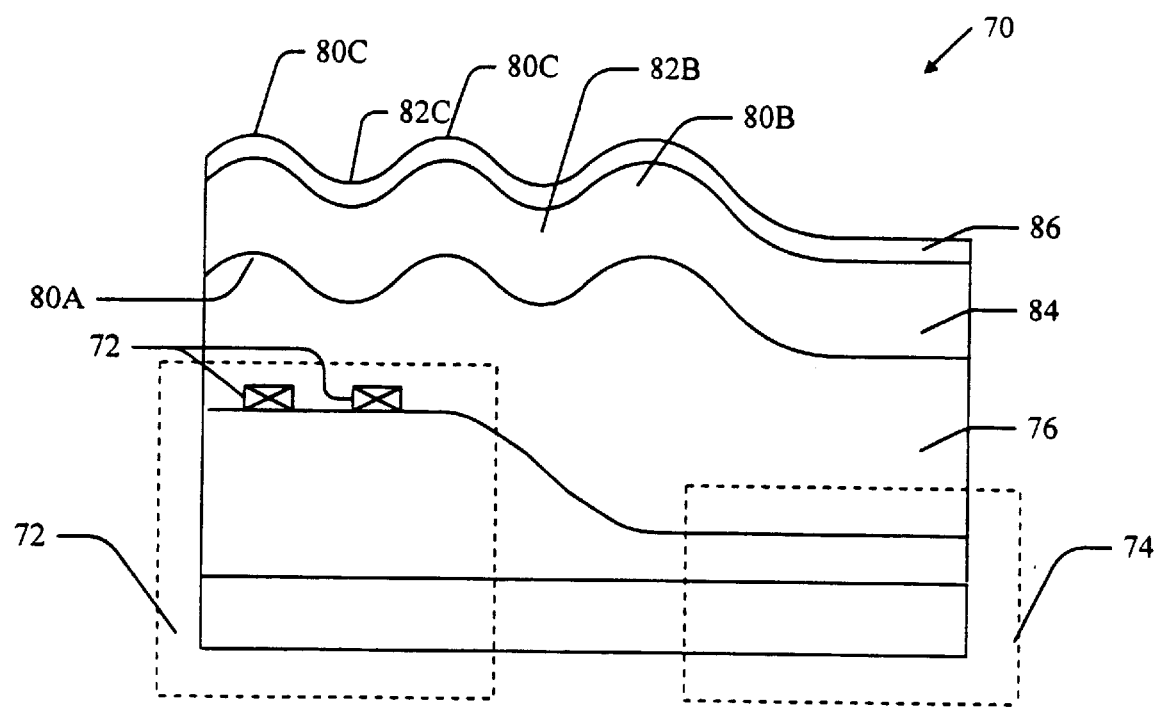

As illustrated in FIG. 4B, a first step in the planarization method of the invention comprises the step of depositing a substantially conformal layer of sacrificial oxide 84 over the dielectric layer 76 in the regions overlying the DRAM structure 72 and the region 74. Also, a substantially conformal layer of amorphous silicon 86 is deposited over the sacrificial oxide layer 84, also over the regions overlying the DRAM structure 72 and the region 74. In the preferred embodiment, the amorphous silicon layer 86 is deposited either by sputtering or plasma enhanced chemical vapor deposition (PECVD), both at a temperature below approximately 500 degrees Celsius. Hence, it will not cause adverse effect on the metal conductors 78 present in the chip 70. Since the sacrificial oxide layer 84 and the amorphous silicon layer 86 are deposited over the dielectric layer 76, the topology of these overlying layers 84 and 86 generally mimics the topology of the dielectric layer 76. Accordingly, the average height of the sacrificial oxide layer 84 and amorphous silicon layer 86 at the region overlying the DRAM structure 72 is greater than at their regions overlying the region 74. In addition, the sacrificial oxide layer 84 and the amorphous silicon layer 86 also include corresponding upper portions 80*b* and 80*c* and corresponding lower portions 82*b* and 82*c*.

Figure 4C:
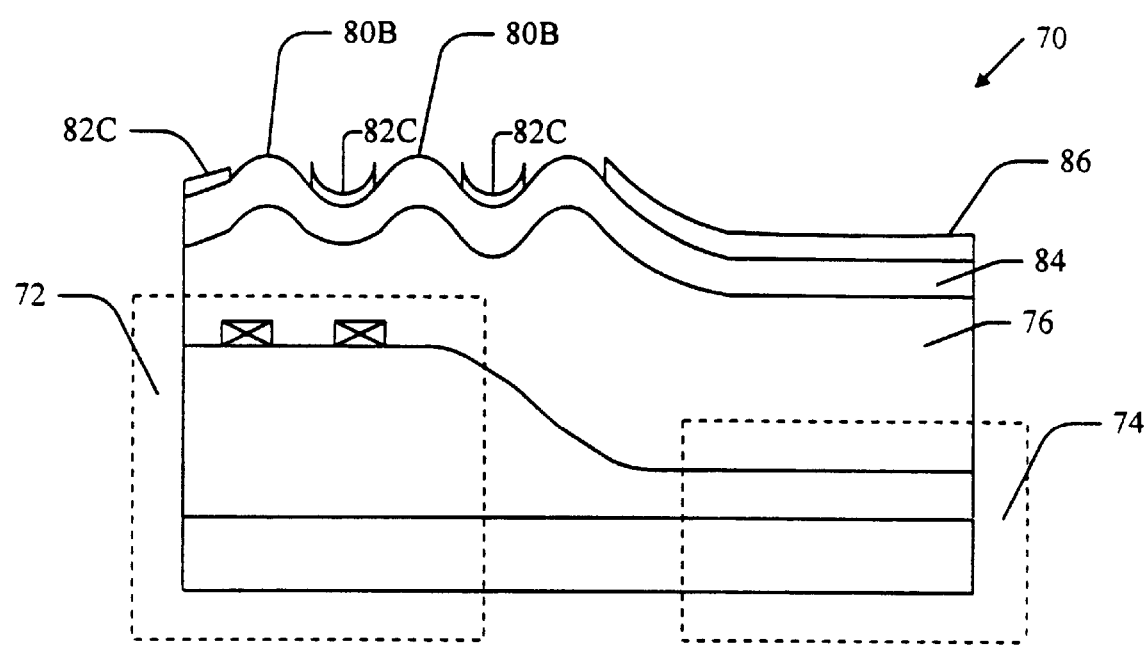

As illustrated in FIG. 4C, a subsequent step in the planarization method of the invention is to perform a first chemical-mechanical polishing (CMP) of the amorphous silicon layer 86 in order to substantially remove the upper portions 80*c* of the amorphous silicon layer 86. This step leaves behind the lower portions 82*c* of the amorphous silicon layer 86, as well as the portion of the amorphous silicon layer 86 that overlies region 74. The remaining portions of the amorphous silicon layer 86 serve as a mask for a subsequent etching step. This step also leaves the top surface of the upper portions 80*b* of the sacrificial oxide layer 84 substantially exposed.

Figure 4D:
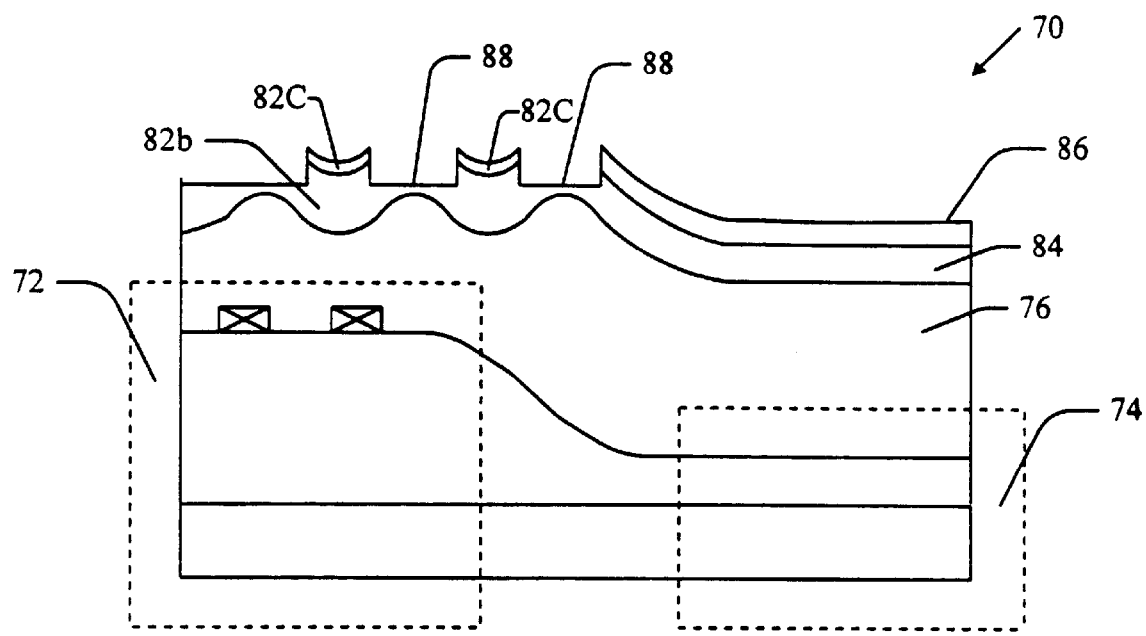

As illustrated in FIG. 4D, a subsequent step in the planarization method of the invention is to perform an etching of the exposed upper portions 80*b* of the sacrificial oxide layer 84. In the preferred embodiment, this etching step can be performed by either dry or wet etching techniques, but the etchant utilized must be one that is highly selective to amorphous or sacrificial layers. During this etching step, the remaining lower portions 82*c* of the amorphous silicon layer 86 serve as self-aligned masks for defining the upper portions 80*b* of the sacrificial oxide layer 84. As a result, a plurality of channels 88 are formed within the sacrificial oxide layer 84 that are situated at substantially the same height.

Figure 2A:
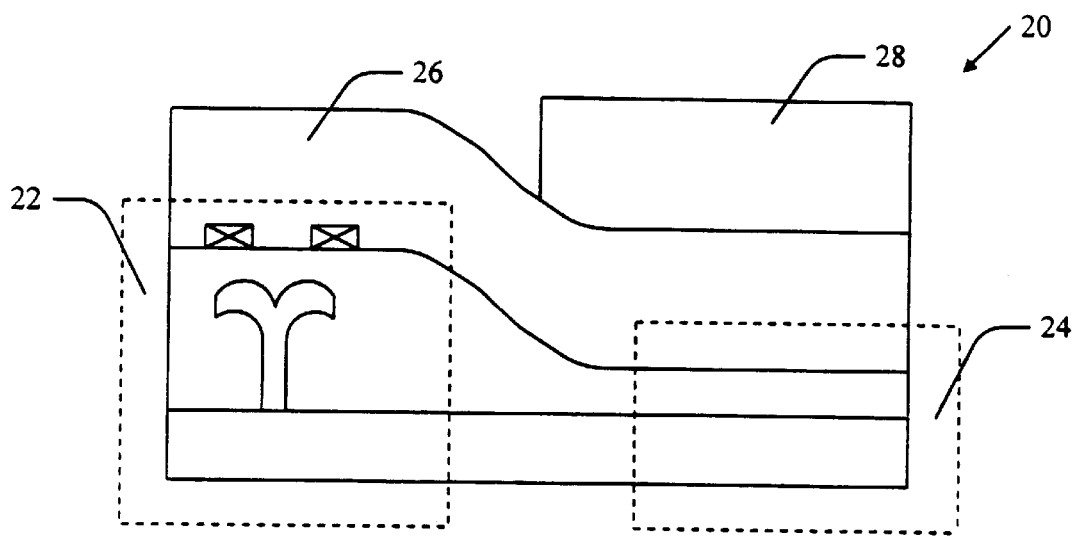
FIGS. 2A–2C illustrate cross-sectional views of an integrated circuit having an embedded DRAM structure at sequential steps of a first conventional prior art planarization process.
Figure 2B:
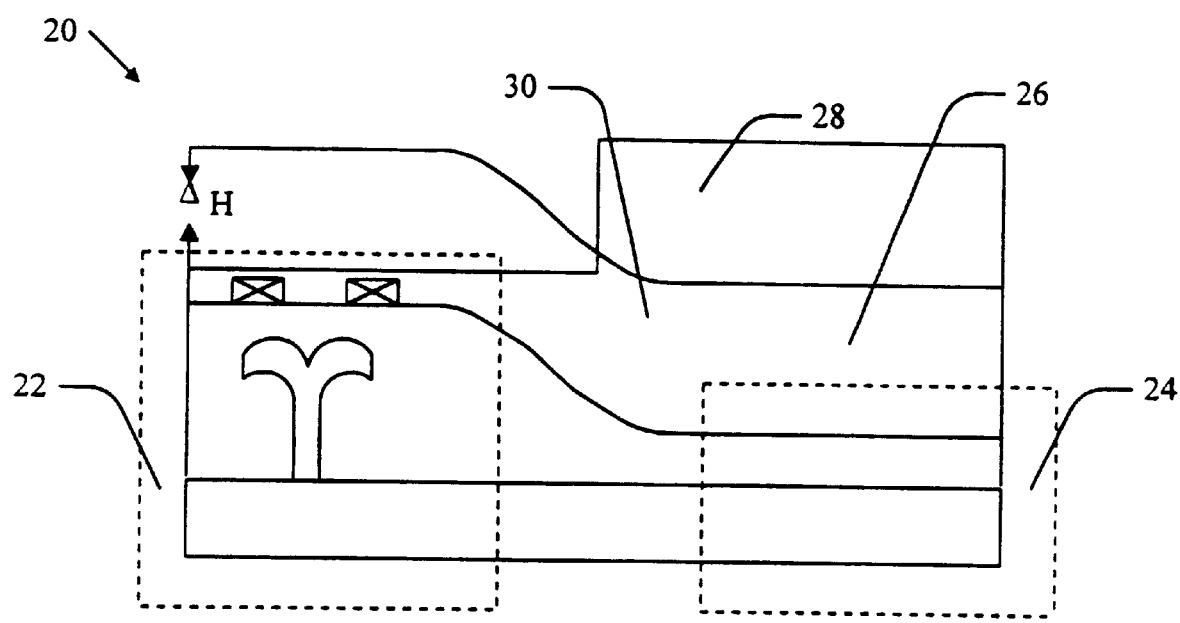
Figure 2C:
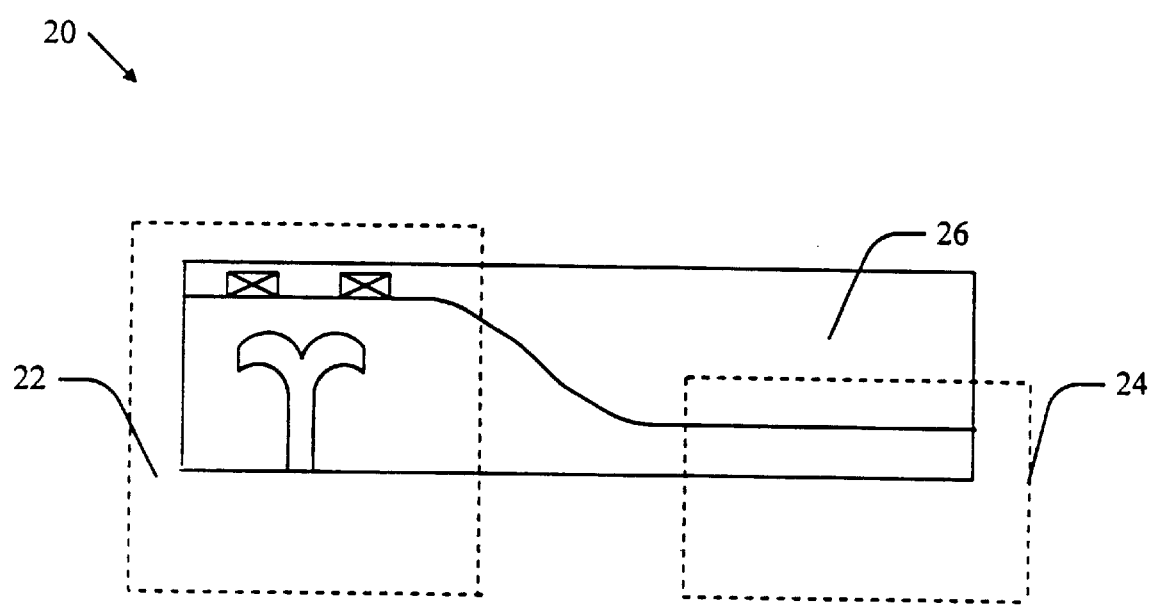
Figure 3A:
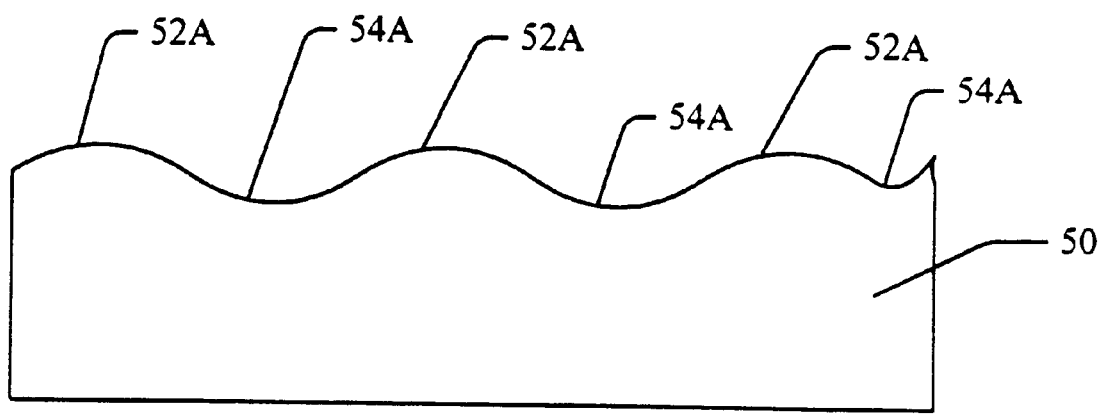
FIGS. 3A–3E illustrate cross-sectional views of an irregular or uneven top surface of a dielectric layer at sequential steps of a second conventional prior art planarization process.
Figure 3B:
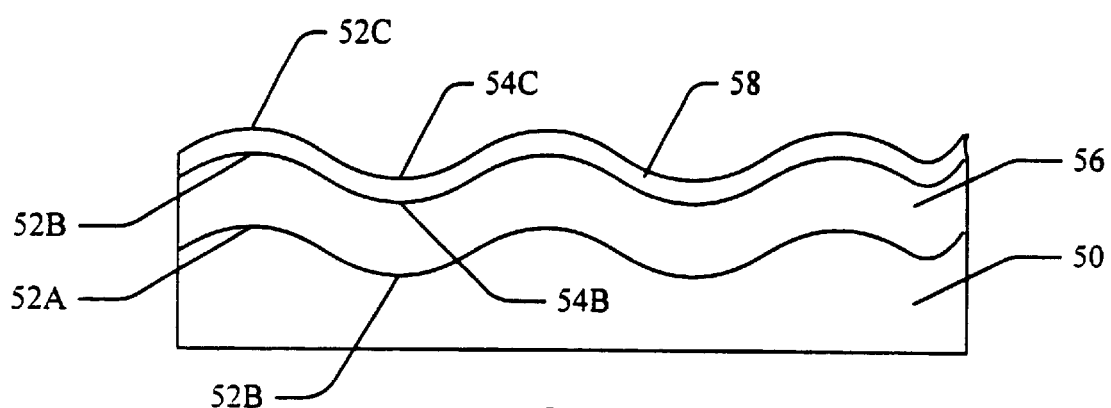
Figure 3C:
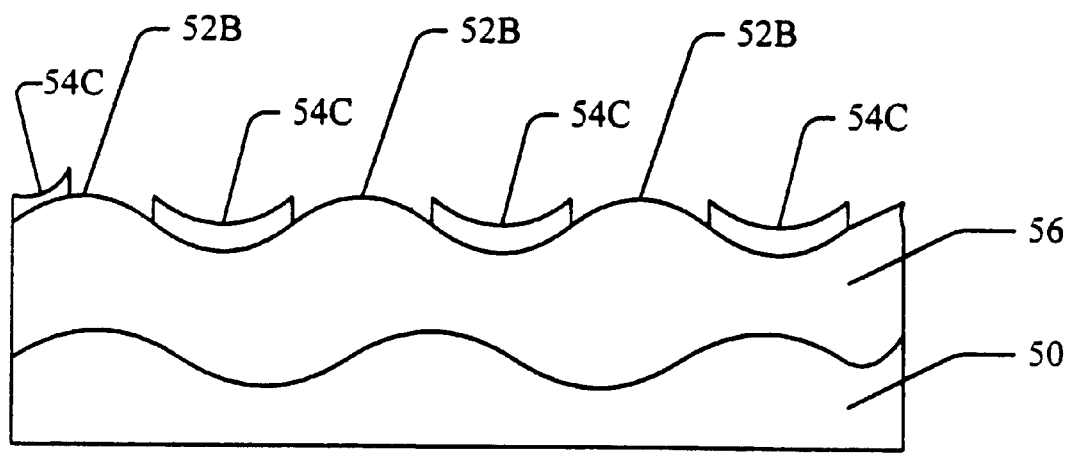
Figure 3D:
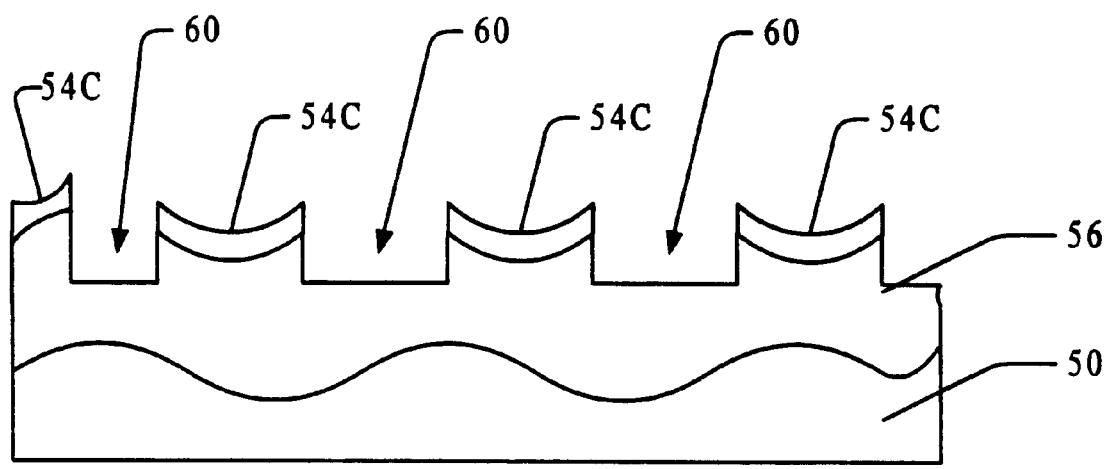
Figure 3E:
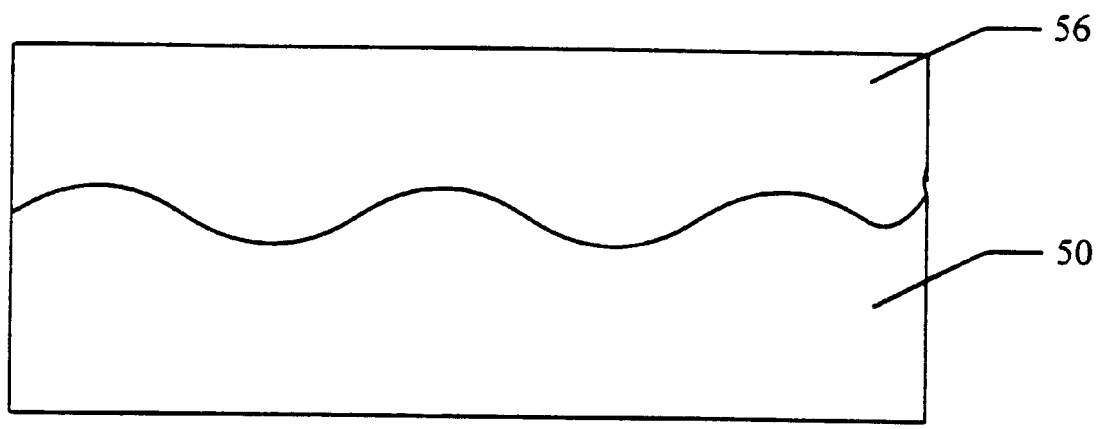
Figure 4E:
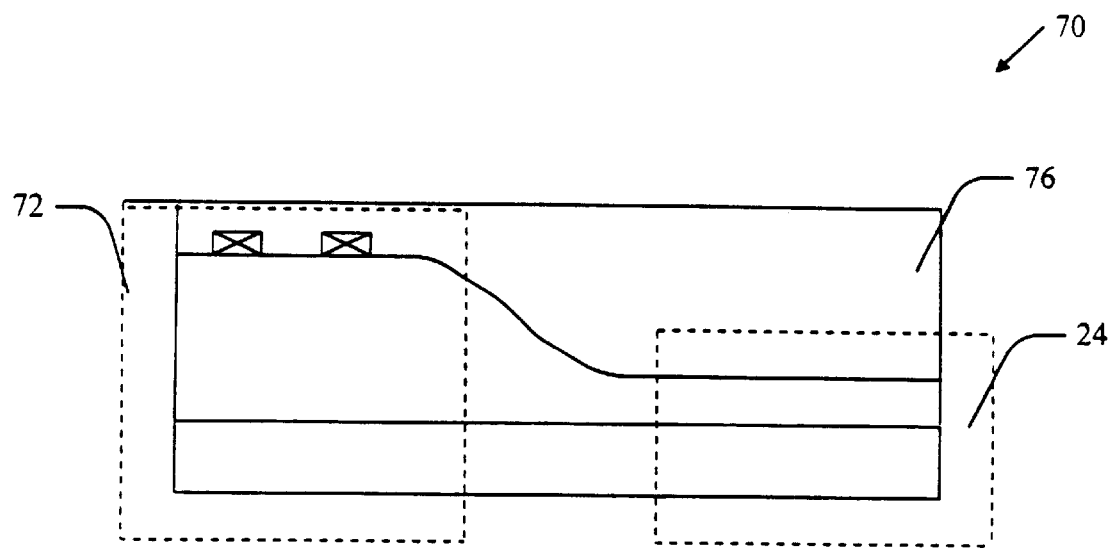

As illustrated in FIG. 4E, a subsequent step in the planarization method of the invention is to perform a second chemical-mechanical polishing (CMP) step to remove the remaining sacrificial oxide layer 84 and the amorphous silicon layer 86, and to substantially planarize top surface of the dielectric layer 76. The advantage of planarization method of the invention is that it does not require a photolithography step as required by the first conventional prior art planarization process described above with reference to FIGS. 2A–2C. An additional advantage is that the depositing of the amorphous silicon layer 86 is performed in an environment that has a temperature of less than about 500 degrees Celsius. At such relatively low temperatures, there are minimal adverse effects on the metal conductors present in the chip 70, such as metal conductors 78 of the embedded DRAM structure 72. Thus, it is a feasible planarization method where metal conductors are present.

While the invention has been described in connection with various embodiments, it will be understood that the invention is capable of further modifications. This application is intended to cover any variations, uses or adaptation of the invention following, in general, the principles of the invention, and including such departures from the present disclosure as come within known and customary practice within the art to which the invention pertains.

What is claimed is:

1. A method of planarizing a dielectric layer having an irregular top surface topology including a first higher and a first lower regions, wherein said first higher region includes first upper and first lower portions, the method comprising the steps of:

forming a substantially conformal layer of sacrificial oxide over said first higher and first lower regions of said dielectric layer, wherein said sacrificial oxide layer includes corresponding second higher and second lower regions, and said second higher region includes second upper and second lower portions coincident with said first upper and first lower portions of said dielectric layer;

forming a substantially conformal layer of amorphous silicon over said second higher and second lower regions of said sacrificial oxide layer, wherein said amorphous silicon layer includes corresponding third upper and third lower regions, and said third upper region includes third upper and third lower portions coincident with said second upper and second lower portions of said sacrificial oxide layer;

removing said third upper portion of said amorphous silicon layer to substantially expose said second upper portion of said sacrificial oxide layer;

removing said second upper portion of said sacrificial oxide layer to form a channel within said sacrificial oxide layer; and polishing off the remaining sacrificial oxide and amorphous silicon, and a portion of said dielectric layer to substantially planarize the top surface thereof.

2. The method of planarizing said dielectric layer of claim 1, wherein said step of forming said amorphous silicon layer includes the step of depositing amorphous silicon material by plasma enhanced chemical vapor deposition at a temperature less than about 500 degrees Celsius.

3. The method of planarizing said dielectric layer of claim 1, wherein said step of forming said amorphous silicon layer includes the step of depositing amorphous silicon material by sputtering at a temperature less than about 500 degrees Celsius.

4. The method of planarizing said dielectric layer of claim 1, wherein said step of removing said second upper portion of said sacrificial oxide layer includes the step of dry etching said second upper portion of said sacrificial oxide layer whereby said third lower portion of said amorphous silicon layer serves as a self-aligned mask to substantially define said second upper portion of said sacrificial oxide being etched.

5. The method of planarizing said dielectric layer of claim 1, wherein said step of removing said second upper portion of said sacrificial oxide layer includes the step of wet etching said second upper portion of said sacrificial oxide layer whereby said third lower portion of said amorphous silicon layer serves as a self-aligned mask to substantially define said second upper portion of said sacrificial oxide being etched.

6. The method of planarizing said dielectric layer of claim 1, wherein said step of polishing off the remaining sacrificial oxide and amorphous silicon, and a portion of said dielectric layer, includes the step of chemical-mechanical polishing said remaining sacrificial oxide and amorphous silicon, and a portion of said dielectric layer.

7. A method of planarizing a layer of material having an uneven surface, comprising:

forming a substantially conformal layer of sacrificial oxide over said uneven surface of said material;

forming a substantially conformal layer of amorphous silicon over said sacrificial oxide layer;

removing a first portion of said amorphous silicon layer to substantially expose a second portion of said sacrificial oxide layer;

removing said second portion of said sacrificial oxide layer; and polishing off the remaining sacrificial oxide and amorphous silicon, and a portion of said layer of material to substantially planarize the top surface thereof.

8. The method of planarizing said layer of material of claim 7, wherein said step of forming said amorphous silicon layer includes the step of forming said amorphous silicon layer at a temperature less than about 500 degrees Celsius.

9. The method of planarizing said layer of material of claim 8, wherein said step forming said amorphous silicon layer includes the step of depositing said amorphous silicon by plasma enhanced chemical vapor deposition.

10. The method of planarizing said layer of material of claim 8, wherein said step of forming said amorphous silicon layer includes the step of depositing said amorphous silicon layer by sputtering.

11. The method of planarizing said layer of material of claim 7, wherein said step of removing said first portion of said amorphous silicon layer includes the step of chemical-mechanical polishing said first portion of said amorphous silicon layer.

12. The method of planarizing said layer of material of claim 7, wherein said step of removing said second portion of said sacrificial oxide layer includes the step of dry etching said second portion of said sacrificial oxide layer wherein said first portion of said amorphous silicon layer serves as a self-aligned mask to substantially define said second portion of said sacrificial oxide being etched.

13. The method of planarizing said layer of material of claim 7, wherein said step of removing said second portion of said sacrificial oxide layer includes the step of wet etching said second portion of said sacrificial oxide layer whereby said first portion of said amorphous silicon layer serves as a self-aligned mask to substantially define said second portion of said sacrificial oxide being etched.

14. The method of planarizing said layer of material of claim 7, wherein said step of polishing off the remaining sacrificial oxide and amorphous silicon, and a portion of said layer of material, includes the step of chemical-mechanical polishing said remaining sacrificial oxide and amorphous silicon, and said portion of said layer of material.

15. A method of planarizing a layer of a first material having an uneven surface, wherein said first material underlies a layer of a second material, and said second material underlies a layer of amorphous silicon, the method comprising the steps of:

removing a first portion of said amorphous silicon layer to form a self-aligned mask that substantially defines a second portion of said second material;

etching said second portion of said second material to form a channel within said second material; and polishing off the remaining second material and amorphous silicon, and a portion of said first material to substantially planarize the top surface of said first material.

16. The method of planarizing said layer of first material of claim 15, wherein said step of removing said first portion of said amorphous silicon layer includes the step of chemical-mechanical polishing of said first portion of said amorphous silicon layer.

17. The method of planarizing said layer of first material of claim 15, wherein said step of etching said second portion of said second material includes the step of dry etching said second portion of said second material.

18. The method of planarizing said layer of material of claim 15, wherein said step of said step of etching second portion of said second material includes the step of was etching said second portion of said second material.

19. The method of planarizing said layer of material of claim 15, wherein said step of polishing off the remaining second material and amorphous silicon, and a portion of said first material, includes the step of chemical-mechanical polishing said remaining second material and amorphous silicon, and said portion of said first material.

* * * * *